US006121865A

United States Patent [19]

Dust et al.

[11] Patent Number: 6,121,865
[45] Date of Patent: *Sep. 19, 2000

[54] SOLENOID ASSEMBLY HAVING A SEALING DEVICE FOR THE ELECTRICAL LEADS

[75] Inventors: Maurice J. Dust, Peoria; Kyle W. Scholl, Dunlap, both of Ill.

[73] Assignee: Caterpillar Inc., Peoria, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 09/127,854

[22] Filed: Aug. 3, 1998

[51] Int. Cl.$^{7}$ .......... H01L 27/02

[52] U.S. Cl. .......... 336/96; 336/92; 336/90; 439/271

[58] Field of Search .......... 336/90, 92, 96, 336/98, 208; 439/588–589, 271, 281

[56] References Cited

U.S. PATENT DOCUMENTS

| | | | |
|---|---|---|---|
| 4,296,784 | 10/1981 | Rodenbeck et al. | 140/92.2 |
| 4,677,408 | 6/1987 | Bastian | 335/255 |
| 4,683,454 | 7/1987 | Vollmer et al. | 335/299 |
| 4,736,177 | 4/1988 | Vollmer et al. | 335/299 |
| 4,810,208 | 3/1989 | Hayes et al. | 439/589 |
| 4,889,316 | 12/1989 | Donahue, Jr. | 251/29.15 |
| 5,220,301 | 6/1993 | Haas et al. | 335/278 |
| 5,481,237 | 1/1996 | Sarfati et al. | 335/278 |
| 5,504,468 | 4/1996 | Hattori et al. | 335/278 |
| 5,581,222 | 12/1996 | Pinaud | 335/278 |
| 5,666,099 | 9/1997 | Ostrem | 336/192 |
| 5,710,535 | 1/1998 | Goloff | 336/192 |

*Primary Examiner*—Michael L. Gellner
*Assistant Examiner*—Anh Mai
*Attorney, Agent, or Firm*—J. W. Burrows

[57] ABSTRACT

A solenoid assembly is provided having a sealing device disposed in a recess of the over-molded material in order to seal the electrical leads extending from the coil of the solenoid through the recess. The sealing device is an elastomeric member having holes defined therein for the electrical leads to pass through and a larger portion that is disposed in the recess. With the larger portion pressed into the recess, a force is transferred through the elastomeric material onto the electrical leads to prohibit ingression of contaminants into the windings of the coil. The electrical leads could be either lead wires or rigid pins. The elastomeric material also serves to provide vibration damping.

4 Claims, 3 Drawing Sheets

SOLENOID ASSEMBLY HAVING A SEALING DEVICE FOR THE ELECTRICAL LEADS

TECHNICAL FIELD

This invention relates to sealing the connector pins or lead wires of a solenoid assembly and more particularly to a sealing device for inhibiting the ingression of contaminants into the coil or windings of a solenoid assembly and to provide vibration damping of the pins or lead wires.

BACKGROUND ART

In known solenoid assemblies, the pins or lead wires extend from the hard over-molded material that surrounds the windings of the coil. During the over-molding process, efforts are made to ensure that the over-molded material is secured to the pins or lead wires. However, due to the different expansion and contraction rates of the over-molded material and the pins or wires, it has proven to be very difficult to ensure a positive seal therebetween. Any ingression of contaminant, such as dirt, moisture, or chemicals, can result in premature failure of the coil assembly.

The present invention is directed to overcoming one or more of the problems as set forth above.

DISCLOSURE OF THE INVENTION

In one aspect of the present invention, a solenoid assembly is provided having a coil disposed in an over-molded material with electrical leads extending from the coil through the over-molded material to the exterior thereof. The solenoid assembly includes a preformed recess in the over-molded material at the location the electrical leads exits the over-molded material. The preformed recess has a predetermined cross-sectional size and shape. An elastomeric member is disposed in the preformed recess and has first and second openings defined therethrough of a size substantially the same size as the electrical leads extending from the over-molded material. The elastomeric member has a cross-sectional shape substantially the same as the shape of the preformed recess and a cross-sectional size that is larger than the cross-sectional size of the preformed recess such that upon passing the electrical leads through the respective first and second openings and inserting the elastomeric member into the preformed recess a compressive force is applied to the respective electrical leads.

BEST MODE FOR CARRYING OUT THE INVENTION

Figure 1:
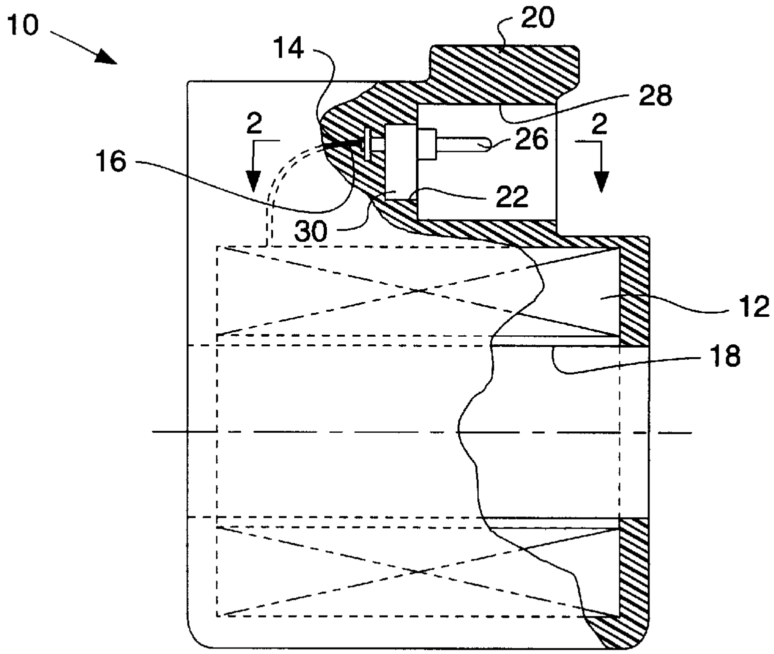
FIG. 1 is a diagrammatic representation of a solenoid assembly incorporating the subject invention.
Figure 2:
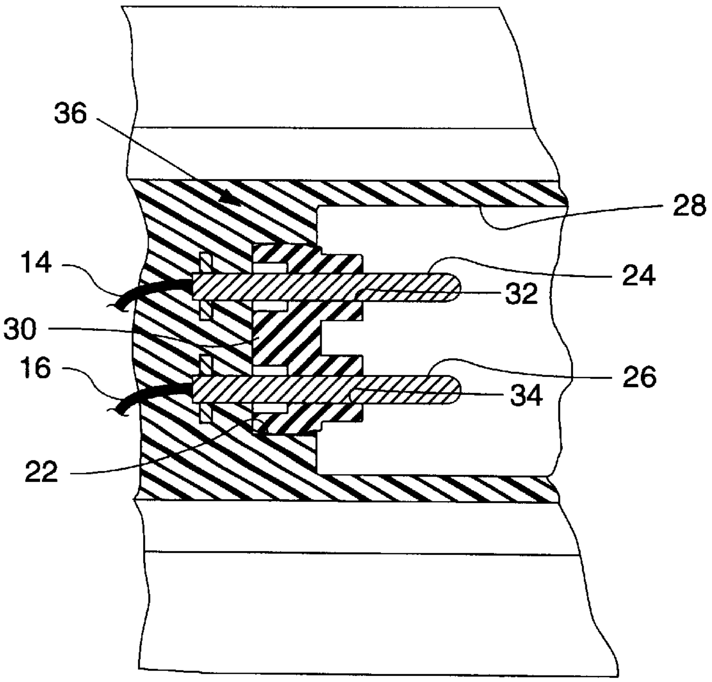
FIG. 2 is a sectional view taken along the line 2—2 of FIG. 1.
Figure 3:
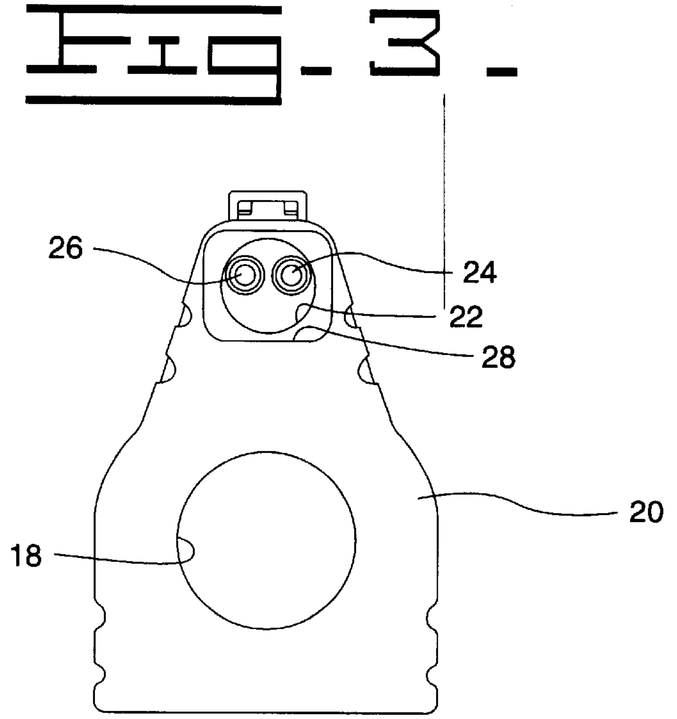
FIG. 3 is an end view of the solenoid assembly of FIG. 1.

Referring to the drawings, and more particularly to FIGS. 1–3 a solenoid assembly 10 is illustrated. The solenoid assembly 10 includes a coil 12 with well known windings.

Electrical leads 14,16 extend from the coil 12. A conventional passage 18 is defined through the coil 12. The coil 12 is encased with an over-molded material 20 to protect the windings of the coil 12 from contaminants. The over-molded material 20 can be made from various known materials, such as various thermo-setting plastics. The over-molded material 20 forms a protective covering or housing and has a preformed recess 22 defined therein. The preformed recess 22 has a predefined cross-sectional shape and size.

The electrical leads 14,16 extend from the coil 12 through the over-molded material 20 and exit the over-molded material within the recess 22. In the subject arrangement, the electrical leads 14,16 connect to respective rigid pins 24,26 within the over-molded material 20 and the rigid pins 24,26 extend from the over-molded material into the recess 22. It is recognized that the electrical leads 14,16 extending from the over-molded material 20 into the recess 22 could be flexible wires with a protective covering that extend completely through the recess 22 without departing from the essence of the subject invention.

A counterbore 28 is defined in the over-molded material 20 of the subject arrangement in general alignment with the recess 22. The counterbore 28 is operative to receive a connector member (not shown) to mate with the rigid pins 24,26 in a conventional manner.

Figure 4:
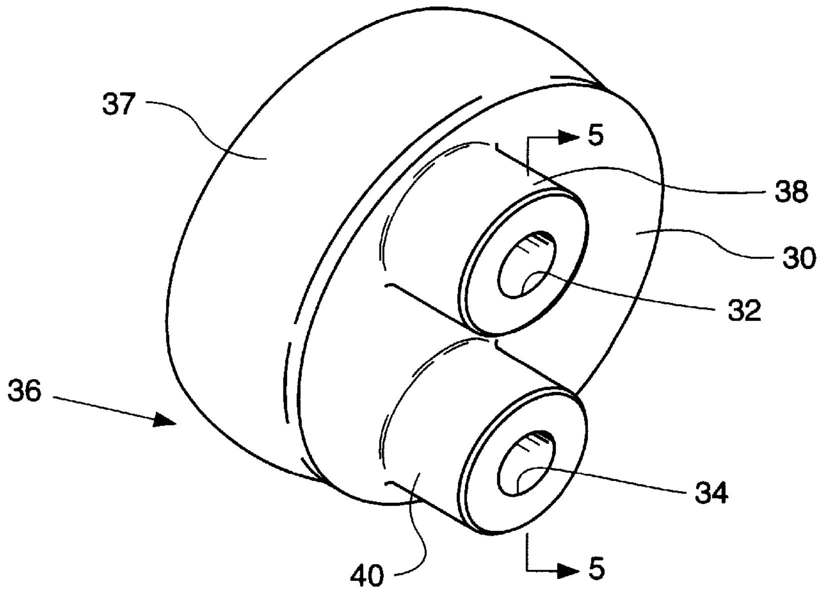
FIG. 4 is an enlarged isometric view of an element taken from FIG. 1.
Figure 5:
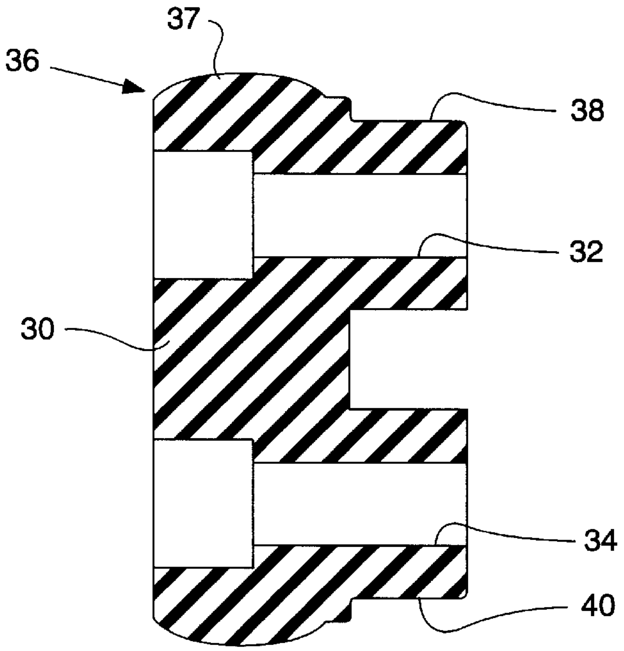
FIG. 5 is a cross-sectional view taken along the line 5—5 of FIG. 4.

Referring to FIGS. 4 & 5 in combination with FIGS. 1–3, an elastomeric member 30 is illustrated and disposed within the recess 22. The elastomeric member 30 has first and second openings 32,34 defined therein. Each of the first and second openings 32,34 are substantially the same size as the electrical leads extending into the recess 22, i.e. the rigid pins 24,26 of the subject embodiment. A portion 36 of the elastomeric member 30 extends into the recess 22. The portion 36 extending into the recess 22 has a predetermined cross-sectional shape substantially the same as the shape of the recess 22 and a cross-sectional size that is larger than the size of the recess 22. The periphery of the portion 36 has a generally convex shape 37.

The remaining portion of the elastomeric member 30 has two projections 38,40 extending from the portion 36 thereof. The respective openings 32,34 defined in the elastomeric member 30 extend through the respective projections 38,40. It is recognized that the projections 38,40 are not critical to the subject invention but in the subject arrangement do interact with the mating plug when installed.

Figure 6:
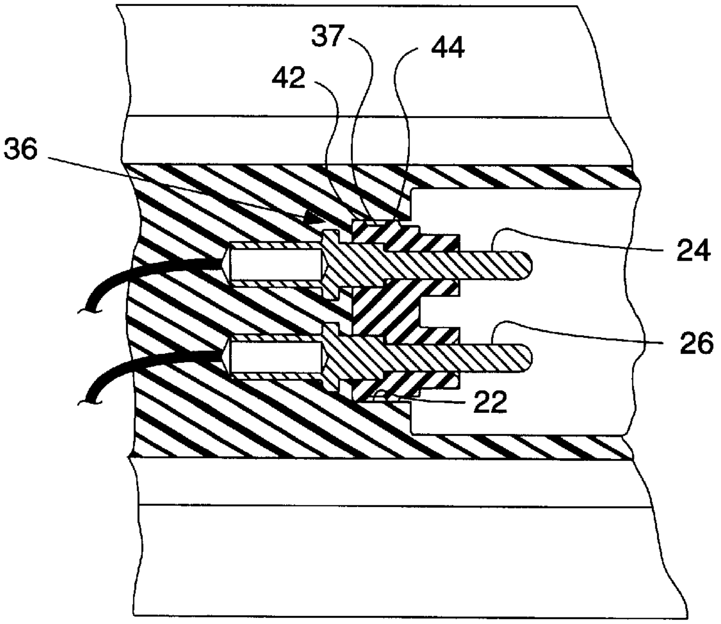
FIG. 6 is a sectional view taken along the line 2—2 of FIG. 1 incorporating an alternate embodiment of the element of FIGS. 4 & 5.

Referring to FIG. 6, another embodiment of the elastomeric member 30 is illustrated. In the embodiment of FIG. 6, like elements have like element numbers. The rigid pins 24,26 of FIG. 6 are shown as being different in construction. However, it is recognized that the rigid pins 24,26 could be straight as clearly shown in FIG. 2 or stepped as shown in FIG. 6. If the rigid pins 24,26 of FIG. 6 are used, the respective openings 32,34 would also be stepped as illustrated therein. Likewise, if straight rigid pins 24,26 are used in FIG. 6, the respective openings 32,34 would be preferably straight.

The periphery 37 of the portion 36 disposed in the recess 22 includes first and second spaced apart annular protrusions 42,44 extending therefrom. One of the annular protrusions 42,44 is located generally adjacent the end of the portion 36 extending into the recess 22. The cross-sectional size taken through each of the protrusions 42,44 is larger than the cross-sectional size of the recess 22 so that insertion of the portion 37 into the recess 22 results in a compressive force being applied to the respective rigid pins 24,26 extending therethrough.

Industrial Applicability

In the operation of the subject invention, the over-molded material 20 completely encircles the windings of the coil 12 to seal the coil 12 from contaminants. However, due to the different rates of expansion and contraction of the over-molded material and the material of the electrical leads 14,16 (pins 24,26) during the molding process, there may not be sufficient sealing therebetween which would allow ingression of contaminants into the coil 12. As previously noted, ingression of contaminants into the coil 12 prematurely shortens the life of the coil. By passing the rigid pins 24,26 through the respective openings 32,34 and then pressing the elastomeric element 30 into the recess 22, a positive seal is provided to inhibit contaminants from passing therethrough.

In the subject embodiment, since the size of the rigid pins 24,26 are substantially the same size as the openings 32,34, the rigid pins 24,26 are free to slip into the openings 32,34. However, as the portion 36 of the elastomeric member 30 enters the recess 22, the periphery 37 of the larger cross-section is forced to reduce in size since the cross-section of the recess 22 is smaller. Due to the cross-section being reduced in size, the compaction of the material of the elastomeric member 30 causes a compressive force to be applied to the respective rigid pins 24,26. This compressive force between the material of the elastomeric member 30 and the respective rigid pins 24,26 provides a positive seal therebetween. Likewise, a positive seal is provided between the recess 22 and the periphery 37 of the portion 36 entering the recess 22.

In the subject embodiment, the elastomeric member 30 is held in the recess 22 by the friction therebetween and further by the insertion of the mating connector (not shown). It is recognized that in the event, the elastomeric member 30 is used to secure coated lead wires (electrical leads), a retaining cap having holes for the lead wires may be used to ensure that the elastomeric member 30 remains in the recess 22.

Referring to the operation of the alternate embodiment set forth in FIG. 6, the operation is basically the same. In the embodiment of FIG. 6, the first and second annular projections 42,44 act in response to insertion of the elastomeric member 30 into the recess 22 to apply a compressive force to the rigid pins 24,26. In this embodiment, there are basically two separate, spaced apart forces acting on the rigid pins 24,26 to provide the positive sealing force. The embodiment of the elastomeric member 30 of FIGS. 4–5 has one area of force transfer but the area of force transfer with respect to each of the rigid pins 24,26 is larger.

In view of the foregoing, it is readily apparent that a solenoid assembly 10 is provided that has a positive seal between the electrical leads (rigid pins 24,26) and the over-molded material 20. This positive seal ensures that contaminants are prohibited from entering the coil 12 through the interface between the electrical leads and the over-molded material 20. It is further apparent that since the rigid pins 24,26 are disposed in an elastomeric material, they are isolated from vibrations that the solenoid assembly 10 is subjected to during operation. Therefore, a solenoid assembly 10 is provided that has longer life since the coil 12 is protected from contaminants and the rigid pins 24,26 are isolated from vibrations.

Other aspects, objects and advantages of this invention can be obtained from a study of he drawings, the disclosure and the appended claims.

What is claimed is:

1. A solenoid assembly having a coil disposed in an over-molded material with electrical leads extending from the coil through the over-molded material to the exterior thereof, the electrical leads having a predetermined cross sectional size and shape, the solenoid assembly comprising:

a preformed recess in the over-molded material at the location the electrical leads exit the over-molded material, the recess has a predetermined cross-sectional size and shape; and an elastomeric member disposed in the preformed recess, the elastomeric member having first and second openings defined therethrough of a size and shape substantially the same as the size and shape of the electrical leads extending therethrough, the elastomeric member having a cross-sectional shape substantially the same as the shape of the preformed recess and prior to installation the elastromeric member having a cross-sectional size that is larger than the cross-sectional size of the preformed recess and when the elastomeric member is disposed in the preformed recess a compressive force is induced into the elastomeric member and the compressive force is transferred to and directly applied to the respective electrical leads to provide a seal between the electrical leads and the respective first and second openings.

2. The solenoid assembly of claim 1 wherein the electrical leads extending from the over-molded material are in the form of rigid pins.

3. The solenoid assembly of claim 2 wherein a portion of the elastomeric member extends into the preformed recess and the periphery of the portion extending into the preformed recess has a convex shape.

4. The solenoid assembly of claim 1 wherein a portion of the elastomeric member extends into the preformed recess and the periphery of the portion extending into the preformed recess has first and second spaced apart annular protrusions of a cross-sectional size that is larger than the cross-sectional size of the preformed recess.

* * * * *